United States Patent
Hafez et al.

(10) Patent No.: US 6,262,609 B1
(45) Date of Patent: Jul. 17, 2001

(54) CLOSED-LOOP VOLTAGE-TO-FREQUENCY CONVERTER

(75) Inventors: Amr N. Hafez; M. I. Elmasry, both of Waterloo (CA)

(73) Assignee: Research In Motion Limited, Waterloo (CA)

(*) Notice: Subject to any disclaimer, the term of this patent is extended or adjusted under 35 U.S.C. 154(b) by 0 days.

(21) Appl. No.: 09/394,188

(22) Filed: Sep. 10, 1999

Related U.S. Application Data

(60) Provisional application No. 60/099,942, filed on Sep. 11, 1998.

(51) Int. Cl.[7] ........................................................ H03L 7/06
(52) U.S. Cl. ........................ 327/156; 327/105; 327/101; 331/1 R; 331/17
(58) Field of Search .................................. 327/101, 156, 327/157, 158, 159, 105; 331/1 R, 17

(56) References Cited

U.S. PATENT DOCUMENTS

| | | | |
|---|---|---|---|
| 4,458,214 | * 7/1984 | Lakomy | 331/17 |
| 4,847,569 | * 7/1989 | Dudzaik et al. | 327/156 |
| 5,335,365 | * 8/1994 | Ballantyne et al. | 331/14 |
| 5,521,556 | * 5/1996 | O'Shaughnessy et al. | 331/1 R |
| 5,821,816 | * 10/1998 | Patterson | 327/105 |
| 6,016,069 | * 1/2000 | Sadowski | 327/156 |
| 6,078,224 | * 6/2000 | Ujiie | 327/156 |

\* cited by examiner

Primary Examiner—Kenneth B. Wells
Assistant Examiner—Paul Dinh
(74) Attorney, Agent, or Firm—Jones, Day, Reavis & Pogue; Charles B. Meyer, Esq.; Krishna K. Pathiyal, Esq.

(57) ABSTRACT

A closed-loop voltage-to-frequency (V/F) converter includes a voltage-controlled-oscillator (VCO) placed in a feedback voltage-locked loop (VLL). This converter achieves both wide bandwidth (for good phase-noise suppression) and good spurious rejection. The closed-loop V/F converter may be further configured in a larger phase-locked loop (PLL) to achieve accurate channel selection that is independent of temperature and process variations.

24 Claims, 6 Drawing Sheets

CLOSED-LOOP VOLTAGE-TO-FREQUENCY CONVERTER

This application claim benefit to provisional application 60/099,942 Sep. 11, 1998.

BACKGROUND OF THE INVENTION

1. Field of the Invention

The present invention is within the field of voltage-to-frequency converters (V/F converters). In particular, the invention comprises a closed-loop V/F converter including a voltage-controlled oscillator ("VCO") configured in a feedback voltage-locked loop. This V/F converter is especially useful in combination with a phase-locked loop ("PLL") frequency synthesizer for an RF receiver of a wireless radio.

2. Description of the Related Art

A primary constraint on the design of a phase-locked loop frequency synthesizer in a wireless radio is its phase-noise performance. The phase-noise of the PLL, generally, is dominated by the phase-noise of the constituent VCO in the range of interest. The phase-noise of the VCO is inversely proportional to its power consumption. Thus, in order to meet the phase-noise requirements for the PLL, it is generally necessary to use expensive, high-quality VCO circuits, and/or it is necessary to increase the power of the VCO, which is disadvantageous in portable radio devices where power is limited.

A free-running VCO is essentially an open-loop system, where any noise in the system directly affects the output with no means of correction. When configured in a phase-locked loop, which is a closed-loop feedback system, the loop corrects the noise of the VCO within its bandwidth. Thus the VCO phase-noise is inhibited within the PLL bandwidth.

In this type of system, it is beneficial to increase the PLL bandwidth as much as possible. But, the maximum PLL bandwidth is limited by the spurious rejection of the loop. Hence, the PLL bandwidth is generally one order of magnitude less than the reference frequency. In a classical PLL-based frequency synthesizer in a wireless transceiver, the reference frequency would be equal to the channel spacing, and the loop does not inhibit the VCO phase-noise in the range of interest.

Therefore, a new architecture for a frequency synthesizer incorporating a VCO is needed.

SUMMARY OF THE INVENTION

The present invention comprises a closed-loop V/F converter that includes a VCO placed in a feedback voltage-locked loop (VLL). This converter achieves both wide bandwidth (for good phase-noise suppression) and good spurious rejection. The closed-loop V/F converter may be further configured in a larger PLL to achieve accurate channel selection that is independent of temperature and process variations.

In the V/F converter, the VCO output is first divided down to a lower frequency and then fed to a frequency-to-voltage converter (F/V). The DC value of the F/V output is proportional to the input frequency. The F/V output is then compared to a reference voltage to generate an error signal. This error signal is filtered by a loop filter and fed back to the VCO control input to create the voltage-locked loop. Although described in terms of a V/F converter, the concepts described in this application are also applicable to a current-to-frequency converter (I/F).

The present invention configures an ordinary VCO in a novel voltage-locked loop to create a V/F converter that overcomes many of the design problems with using VCOs in a radio device. Because the VCO is configured in a feedback loop, the phase noise of the VCO is corrected and inhibited within the loop bandwidth. By making the loop bandwidth sufficiently large, the VCO noise contribution to the V/F converter's output is greatly reduced. This relaxes the design constraints on the VCO, thus allowing for a VCO with lower power consumption and possibly a monolithic VCO.

The bandwidth of the loop in this V/F converter circuit is not limited by spurious rejection (as with a classical PLL), because the voltage spurs occur at the frequency at which the F/V is operating. Since this frequency can be designed to be very large (e.g., 50MHz) without affecting tunability, the spurs are not close to the carrier frequency, and are also sufficiently attenuated by the loop transfer function.

BRIEF DESCRIPTION OF THE DRAWINGS

The present invention provides numerous advantages over presently known VCOs and PLLs as will become apparent from the following description when read in conjunction with the accompanying drawings wherein.

DETAILED DESCRIPTION OF THE DRAWINGS

Figure 1:
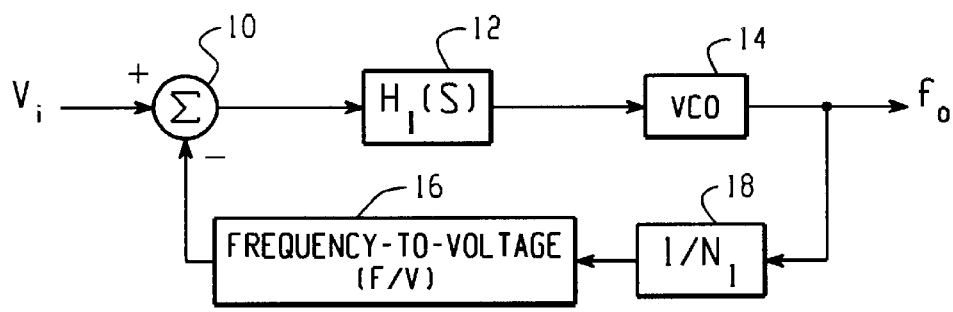
FIG. 1 is a circuit schematic of a preferred closed-loop V/F converter.

A preferred circuit architecture for a closed-loop V/F converter for use with a PLL is shown in FIG. 1. In this V/F converter, an ordinary VCO 14 is configured in a feedback loop. The output of the VCO 14 ($f_o$) is first divided down to an intermediate frequency where an accurate frequency-to-voltage conversion is feasible, using a I/N divider circuit 18. The value "N" of the divider circuit 18 could be either fixed or variable, depending on the implementation of the V/F converter. The F/V 16 produces a voltage output that is proportional to the input frequency from the output of the divider 18. This output is subtracted from a reference voltage ($v_r$) by summer circuit 10, and the generated error signal output from the summer 10 is filtered by a loop filter, $H_1(s)$ 12, which determines the bandwidth and spurious rejection of the circuit. If the loop filter 12 is chosen to have a pole at DC (i.e., an integrator), then the steady-state error signal is zero and the output of the F/V 16 is equal to the input reference. The output frequency $f_0$ is equal to:

$$f_o = \frac{N_1}{K'} Vi \quad [1]$$

where K' is the gain of the FN 16 in V/Hz. Hence, the circuit structure provides a voltage-to-frequency converter with a control voltage of $v_i$, and a gain of $N_1/K'$.

Figure 2A:
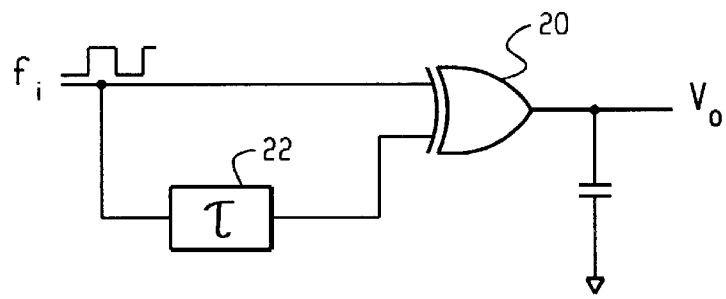
FIGS. 2A–2B are circuit schematics of two alternative frequency-to-voltage converter circuits.
Figure 2B:
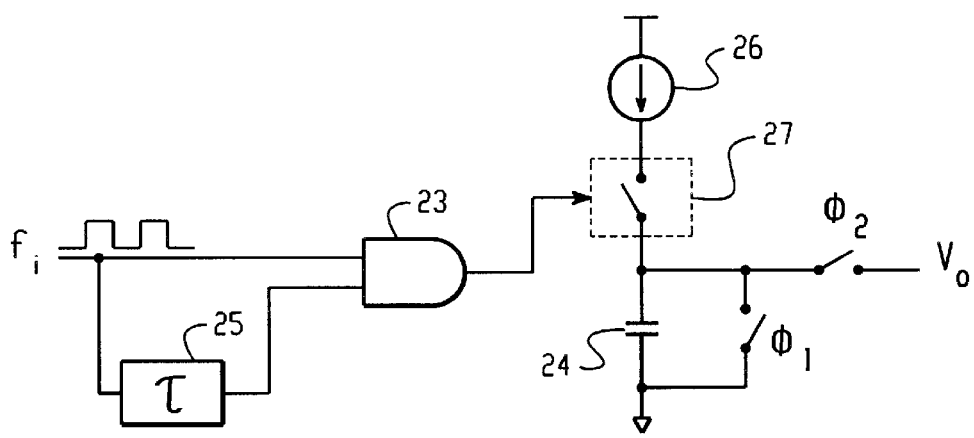

One element in this preferred V/F converter is the F/V 16 placed in the feedback path. Two possible architectures for an F/V 16 are shown in FIGS. 2A–2B, although other architectures may be possible and are within the scope of the invention. In FIG. 2A, an XOR gate 20 in combination with a delay element 22 produces a square wave at twice the input frequency with a duty cycle (and hence a DC level) directly proportional to the input frequency. In FIG. 2B, a capacitor 24 integrates a constant current source 26 for a duration controlled through switch 27 by the input signal, $f_i$, and is reset every cycle of the input. If the capacitor 24 voltage is sampled at the end of each cycle, the output level is indicative of the input frequency. As explained below, since the V/F converter is preferably configured in a larger PLL, the linearity of the F/V 16 is not critical.

FIG. 2B also shows an optional configuration that adds a delay element (tau) 25 (where the tau is fixed) and an AND gate 23 between the input signal, $f_i$, and the switch 27. This configuration reduces the duration when the switch 27 is conducting, thus allowing for an increased frequency-to-voltage gain. For example, if the input is assumed to have a 50% duty cycle, then using, then using the delay element 25 and the AND gate 23, the switch 27 will be closed (conducting) for a duration of only (T/2 -tau) every cycle, where T is the time period of the input. This allows the circuit designer to increase the current, and/or to reduce the capacitance, thus increasing the frequency-to-voltage gain without saturating the output voltage. High FN gain is important in such a circuit so that noise at the input does not result in severe noise at the output.

The preferred architecture shown in FIG. I has the advantages of feedback systems. The most significant of these advantages is the correction effect of the loop. An S-domain analysis shows that this loop, similar to a PLL, inhibits the VCO phase-noise within its bandwidth. Since the reference in this case is a voltage level, not a frequency signal, it does not result in any spurious noise at the output, and hence the bandwidth can be made very wide resulting in improved VCO phase-noise suppression.

The spurious noise in this architecture comes from the F/V 16 output. According to the design of the FN 16, there may be a certain amount of voltage spikes on its output. The frequency of these spikes are equal to the input frequency of the F/V 16. Since this frequency could be relatively very large (e.g., 50–100MHz), even a high loop bandwidth (e.g., 5MHz) achieves adequate spurious suppression. In addition, since the spurious frequency is in the tens of MHZ range away from the carrier (as opposed to the channel spacing in a classical PLL case), the spurious rejection requirement might even be more relaxed.

Another advantage of this architecture is the fact that the gain of the loop is controllable. By designing the F/V 16 such that its gain is tunable (e.g., through a bias current), then the gain of the closed-loop V/F converter could be dynamically varied. The output frequency could thus be tuned through the input voltage reference and/or through the F/V gain, and/or through the division ratio, N.

Figure 3:
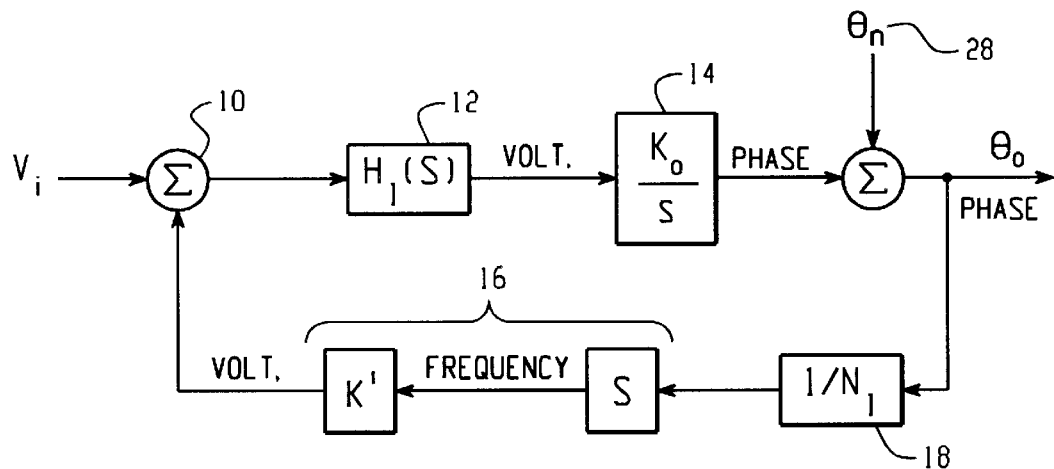
FIG. 3 is an S-domain block diagram of the closed-loop V/F converter of FIG. 1.

FIG. 3 shows the S-domain block diagram of the preferred closed-loop V/F converter. The nature of the signals is indicated on each node. The noise source $\Theta$ 28 represents the VCO 14 phase noise. The output of the loop is a phase (hence the VCO 14 is modeled as $K_0/s$). This allows for a proper comparison with an ordinary PLL, because the phase noise of the VCO 14 is in the phase domain. The s-block in the feedback path transforms the signal from the phase to the frequency domain, and the F/V 16 is modeled by its gain K' (assuming that its delay is negligible with respect to the loop bandwidth).

Setting $\Theta_n$ 28 to zero, the transfer function between the output frequency and the input voltage (vi) reference is $$f_o = s\theta_0 = (N_1 vi/K') \frac{\frac{K_0 K'}{N_1} H_1(s)}{1 + \frac{K_0 K'}{N_1} H_1(s)} \quad [2]$$

This result differs from an ordinary PLL. In an ordinary PLL, the relation between the output and input phases is similar to the above equation if each $H_1(s)$ is replaced by $H_1(s)/s$. This leads to the fact that a PLL with a first order loop filter, $H_1(s)$, has a second order transfer function. In the present case however, this extra order is missing. This is due to the fact that the frequency of the output and not the phase is sensed in the feedback path (i.e., due to the s-block in the feedback path). A closer look, however, shows that the presence of this s-block in the feedback path adds a phase shift of 90°. This cancels the 90° phase shift introduced by the $K_0/s$ block 14 in the feed-forward path, and thus the phase margin is improved by an additional 90°. This extra phase margin can be utilized to increase the order of the loop filter, $H_1(s)$ 12, without affecting the loop stability. Thus, since a higher order loop filter can be used, the transfer function in [2] is similar to the response of an ordinary PLL. For example, if $H_1(s)$ is chosen to be $$H_1(s) = K_1 \frac{1 + s\tau_1}{s^2} \quad [3]$$

then the output frequency would be $$f_0 = (N_1 v_i / K') \frac{2\zeta(s/\omega_n) + 1}{(s/\omega_n)^2 + 2\zeta(s/\omega_n) + 1} \quad [4]$$

where $$\omega_n = \sqrt{\frac{K_0 K' K_1}{N_1}} \quad [5]$$

-continued $$\zeta = \frac{\tau_1 \omega_n}{2} \quad [6]$$

and $K_0$ is the VCO gain in Hz/V. This is similar to the transfer function of an ordinary PLL.

As for the loop response to the VCO phase noise, the output phase is given by $$\Theta_o = \Theta_n \frac{1}{1 + \frac{K_o K'}{N_1} H_1(s)} \quad [7]$$

And for a second order loop filter, $$\Theta_o = \Theta_n \frac{(s/\omega_n)^2}{(s/\omega_n)^2 + 2\zeta(s/\omega_n) + 1} \quad [8]$$

Thus, similar to a classical PLL, the VCO phase noise is inhibited within the loop bandwidth by a slope of 40 dB/decade.

Figure 4:
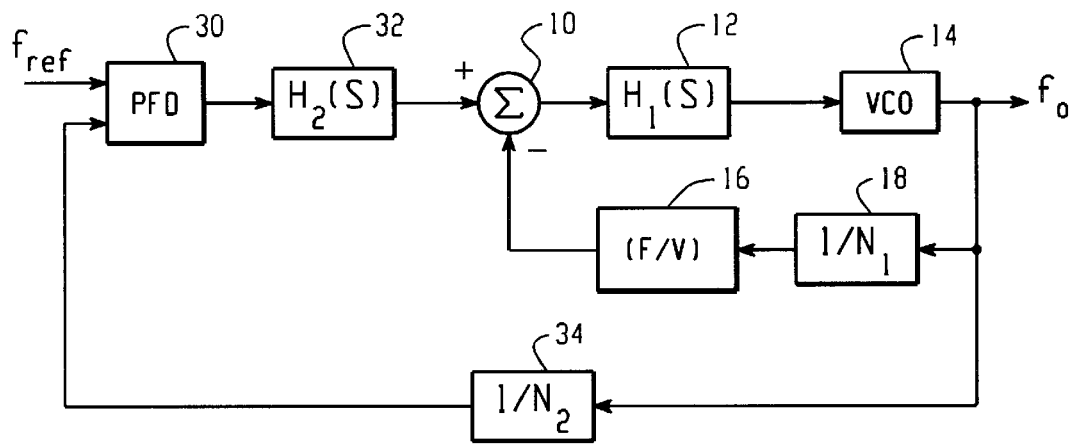
FIG. 4 is a circuit schematic of a preferred PLL architecture utilizing the closed-loop V/F converter shown in FIG. 1.

In order to make the output frequency independent of any nonlinearities, or temperature variations associated with the F/V, the closed-loop V/F converter is further configured in a larger PLL as shown in FIG. 4. This architecture is essentially a classical PLL with the ordinary open-loop VCO replaced by the closed-loop V/F converter architecture (10–18). At steady state, the inputs of the phase/frequency detector (PFD) 30 are phase-locked and the output frequency is equal to $N_2 f_{ref}$. If $f_{ref}$ is derived from an accurate, temperature-compensated crystal oscillator, then temperature and process variation no longer affects the output frequency.

In a wireless radio, $f_{ref}$ is chosen to be equal to the channel spacing, and accurate frequency synthesis is achieved. While the bandwidth of the overall loop is kept one decade less than $f_{ref}$, for adequate spurious rejection, the VCO phase-noise is still inhibited within the large bandwidth of the closed-loop V/F converter. Thus, the architecture decouples the VCO phase-noise and the $f_{ref}$ spurious rejection. Unlike the ordinary PLL, where the choice of the loop bandwidth is a tradeoff between the two, this architecture adds one more design parameter (the bandwidth of the closed-loop V/F converter) that allows for the simultaneous rejection of the VCO phase-noise and the reference spurious. Also, since the bandwidth of the overall PLL is small, the phase-noise of the reference frequency (which increases by 20 $\log N_2$ when mapped to the output) would be attenuated in the operating range of interest.

Another advantage of this architecture is the 1/f noise reduction. As explained below, VCO phase-noise that is within the bandwidth of both the closed-loop V/F converter and the overall loop encounters an extra order of correction. This would reduce the phase-noise very close to the carrier that is caused by the 1/f and the $1/f^2$ noise. In the same manner, noise at the input reference frequency that is beyond both the closed-loop V/F converter bandwidth and the overall loop bandwidth is further attenuated.

Figure 5A:
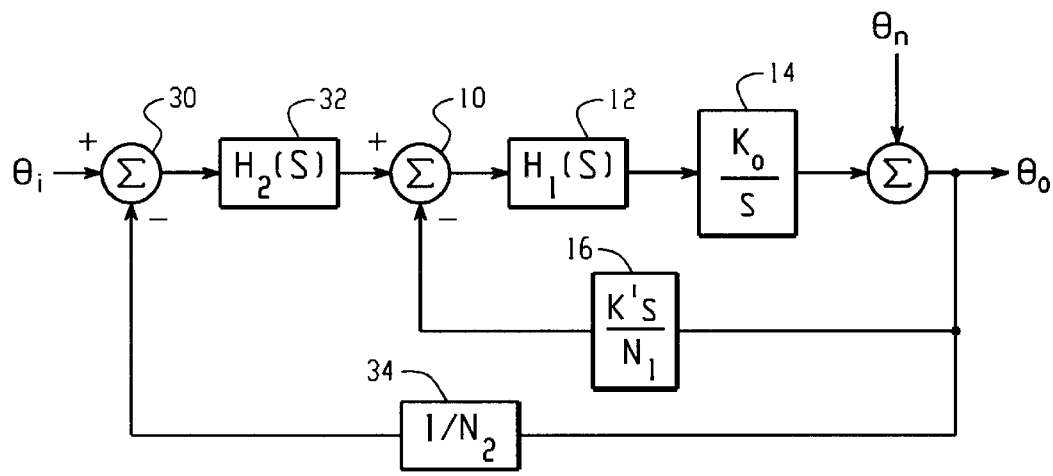
FIG. 5A is an S-domain block diagram of the PLL architecture of FIG. 4.

It is important to note that for the loop stability not to be affected, it is preferable that the inner closed-loop V/F converter be much faster than the outer loop. This is in agreement with the purpose of the architecture, which is having a very large closed-loop V/F converter bandwidth, for good phase-noise rejection, and a small overall loop bandwidth for adequate reference and phase-noise spurious rejection. It can be shown that for a first- order loop filter, $H_2(s)$ 32, and a closed-loop V/F converter bandwidth that is only ten times larger than the overall bandwidth, the phase margin of the overall loop changes by less than 0.2°. An S-domain block diagram of the overall PLL is shown in FIG. 5A. The PLL loop filter, $H_2(s)$ 32 is assumed to be a classical first-order charge-pump filter, with a current source of $I_p$, a capacitor C, and resistor R. By writing the transfer function, the natural frequency and damping factor of the overall PLL are:

$$\omega_{n2} = \sqrt{\frac{N_1 I_p}{2\pi N_2 C K'}} \quad [9]$$

$$\zeta = \frac{RCWn}{2} \quad [10]$$

Figure 5B:
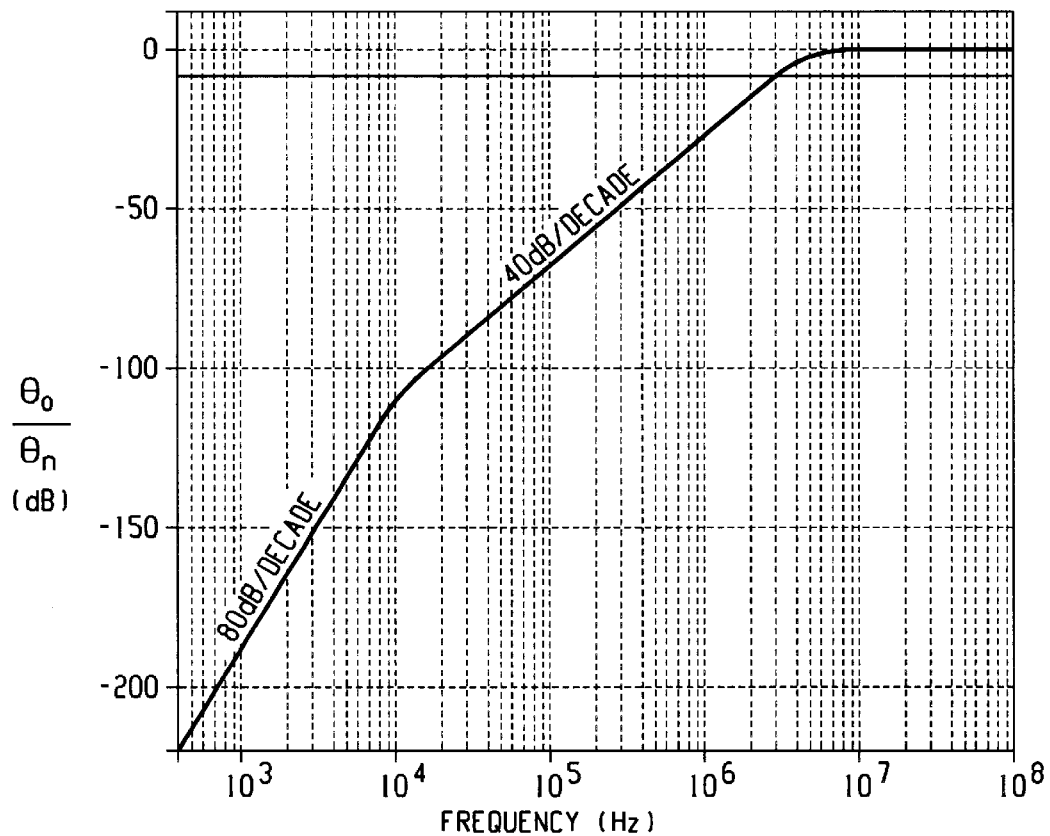
FIG. 5B is a frequency response plot of FIG. 5A.

This natural frequency is preferably less than the natural frequency of the closed-loop V/F converter in order to guarantee stability. If the natural frequency of the overall PLL is set to be 10 kHz and that of the closed-loop V/F converter is 5MHz, and for damping factors of 0.707, the frequency response of the loop to the VCO phase-noise would be that shown in FIG. 5B. As shown, the noise is attenuated within the closed-loop V/F converter bandwidth by 40 dB/decade. For very small offsets from the carrier, the slope increases to −80 dB/decade providing extra attenuation for noise that is very close to the carrier.

Figure 6:
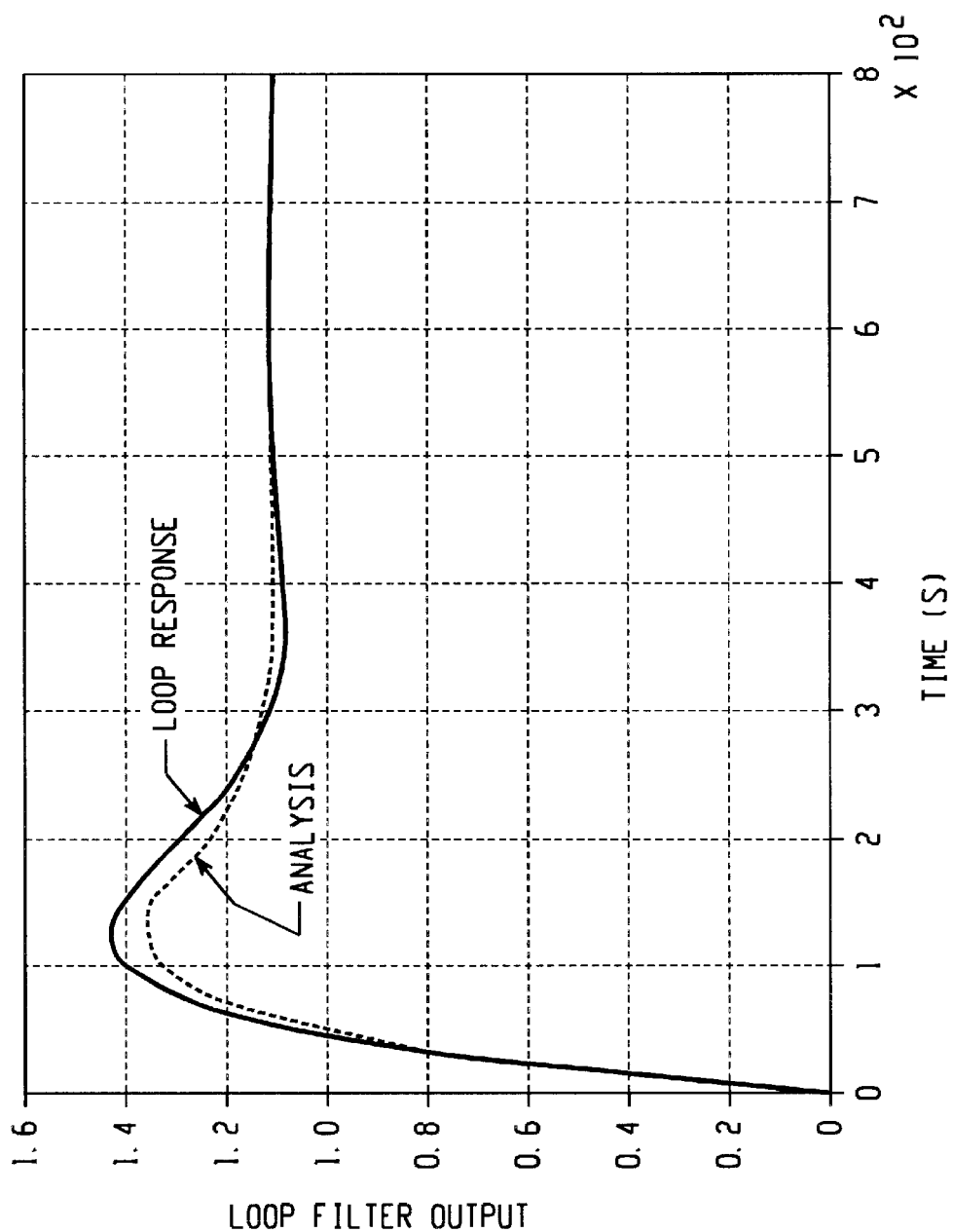
FIG. 6 is a plot showing a comparison of the simulated transient response of the analytical model.

System-level simulations of the closed-loop V/F converter were conducted by the inventors. The preferred architecture was built in Simulink™ of Matlab™. The frequency-to-voltage converter simulated was that of FIG. 2B. The natural frequency and damping factor of the loop were chosen to be 2.8MHz and 0.7 respectively. The center frequency was chosen to be 1GHz and the division ratio, $N_1$, was 10. In order to validate our S-domain analysis, the transient response of this loop was compared to that of the system of FIG. 3, with the same parameters. The response of the loop filter output (which is directly proportional to the output frequency) is shown in FIG. 6. As seen, the two outputs are in close agreement. The increase in overshoot for the closed-loop V/F converter could be attributed to the fact that the delay of the F/V (which decreases the phase margin of the loop) was not accounted for in the S-domain analysis.

Figure 7:
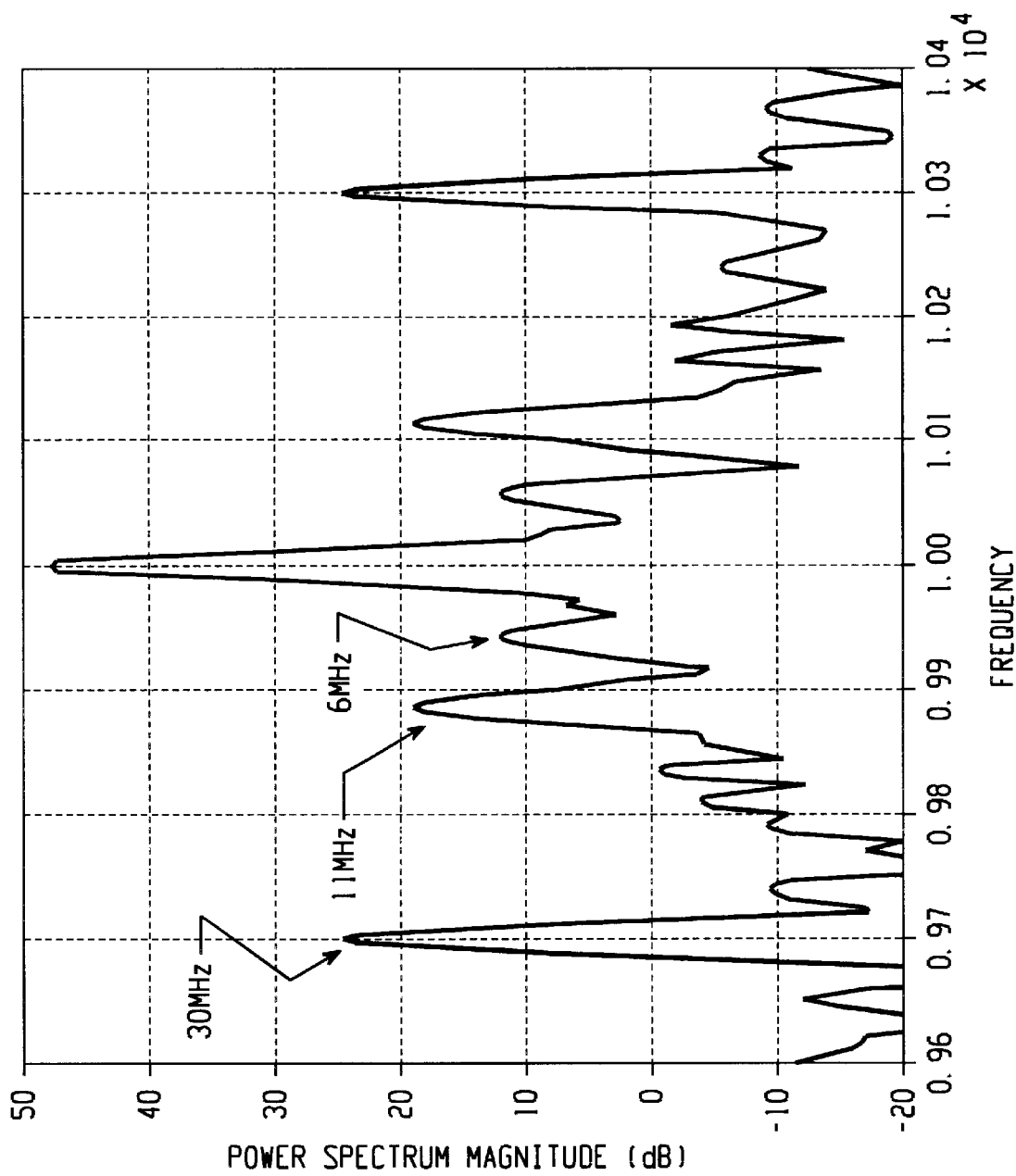
FIG. 7 is a plot showing the simulated closed-loop V/F converter response or the V/F with the VCO phase-noise.

The response of the loop to the VCO phase-noise is shown in FIG. 7. Here, the bandwidth of the loop was increased to 12.5MHz. Three noise sources were injected in the phase of the VCO at frequencies of 6, 11 and 30MHz. Their amplitudes were equal and were 26 dBc below the carrier. As shown, the component within the loop bandwidth has been attenuated by more than 10 dB. The component at 11 MHz experienced only a small attenuation, as it is on the edge of the bandwidth, while the 30MHz was not attenuated. This is in good agreement with the analysis results in FIG. 5(b).

Figure 8:
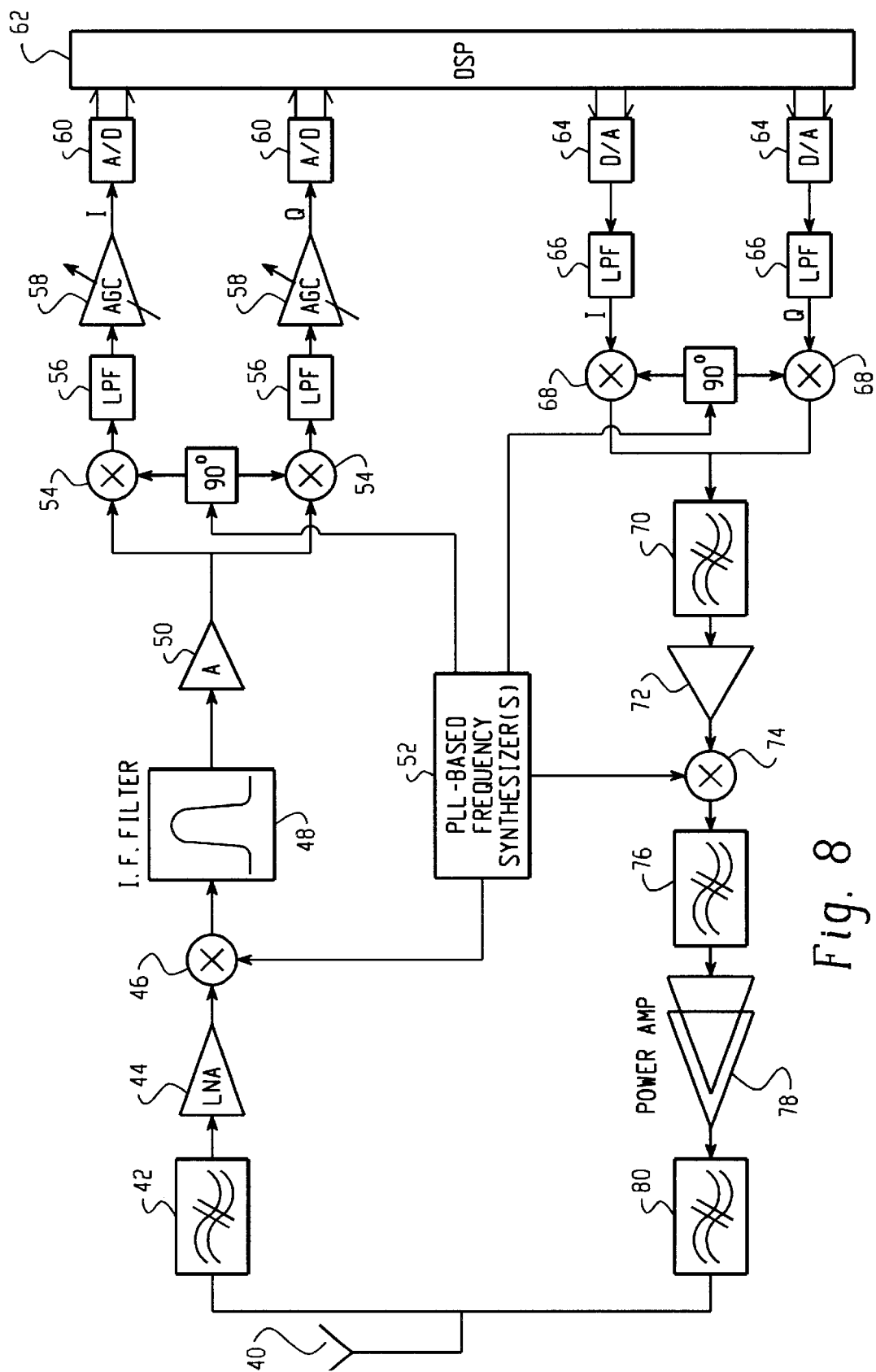
FIG. 8 is a block diagram of a two-way radio transceiver incorporating a PLL as set forth in FIG. 4.

FIG. 8 is a block diagram of a wireless data communications device, such as a two-way radio transceiver, incorporating a PLL as set forth in FIG. 4. There are two paths, a receive path (the upper path) and a transmit path (the lower path.) In the receive path, the signal is picked up by the antenna 40 and filtered with a SAW filter 42. This filter 42 is responsible for rejecting the image channel. The RF signal is then amplified by a low-noise amplifier (LNA) 44. The LNA 44 exhibits a very low noise level so that the noise will not overwhelm the often weak RF signal. The amplified signal is then translated from the RF frequency band to an intermediate frequency (I.F.) via the mixer 46. The mixer 46 multiplies the output of the LNA 44 with the LO signal produced by the frequency synthesizer 52. The LO signal is a high-frequency signal that should be of high spectral purity. Channel selection is performed by tuning the LO signal in steps equal to the channel spacing.

At I.F., a high quality-factor SAW filter 48 passes the desired channel and filters out the unwanted adjacent channels. The signal is then further amplified 50 and mixed down (in quadrature) to baseband (DC) 54. A low-pass filter 56 rejects any residual unwanted signals and an analog-to-digital (A/D) converter 60 converts the analog signal to the digital domain for processing by an associated digital signal processor (DSP) 63. An automatic gain control (AGC) element 58 precedes the A/D. The function of this element is to adjust the gain according to the strength of the input signal so as to present the A/D with a signal of relatively constant amplitude.

On the transmit side, the digital signal processor (DSP) processes the digital transmit data and produces the modulated signal in a digital format. The modulated digital signal is converted to analog via a pair of D/A converters 64 (one for each of the I and Q modulation signals) and filtered 66. The I/Q signals are then mixed up (in quadrature) to an intermediate frequency via mixers 68, where the combined signal is then filtered 70 and amplified 72. The filter 70 at the I.F. frequency in the transmit path rejects any carrier feedthrough or mixer spurs. The signal is then mixed 74 up from the I.F. frequency to the RF frequency using another LO signal from the same or another frequency synthesizer 52. The signal is then filtered 76 and fed to a power amplifier 78, which substantially increases the signal power level. The signal is then transmitted through the antenna 40 through filter 80.

In this architecture, usually two frequency synthesizers 52 are employed. One to provide the high-frequency LO signals to the receiver and transmitter and the other to provide the two low-frequency signals for the quadrature mixers 54, 68. The number of frequency synthesizers can vary according to the values of the receive and transmit bands and to whether the receiver and transmitter operate simultaneously.

Having described in detail the preferred embodiments of the present invention, including its preferred modes of operation, it is to be understood that this operation could be carried out with different elements and steps. This preferred embodiment is presented only by way of example and is not meant to limit the scope of the present invention.

We claim:

1. A voltage-to-frequency conversion system, comprising:
   a voltage source configured to generate a reference voltage signal;
   a feedback loop including a frequency to voltage converter configured to generate a feedback voltage signal in response to a feedback frequency signal, wherein the frequency to voltage converter includes an XOR gate logic device having first and second input nodes and an output node, the first input node being configured to receive the feedback frequency signal, the second input node being configured to receive a time delayed version of the feedback frequency signal, and the output node being coupled to a capacitor;
   a summer configured to mathematically combine the reference voltage signal and the feedback voltage signal;
   a loop filter coupled to the summer and configured to filter the mathematically combined signal; and
   a voltage controlled oscillator (VCO) coupled to the loop filter and the feedback loop.

2. The system of claim 1, further comprising:
   a frequency divider coupled between the VCO and the frequency to voltage converter to generate the feedback frequency signal from an output signal of the VCO.

3. The system of claim 1, wherein the loop filter is a low pass filter.

4. A voltage-to-frequency conversion system comprising:
   a voltage source configured to generate a reference voltage signal;
   a feedback loop including a frequency to voltage converter configured to generate a feedback voltage signal in response to a feedback frequency signal, wherein the frequency to voltage converter includes a constant current source, a capacitor, and a switching device, wherein the capacitor is coupled to the constant current source via the switching device;
   a summer configured to mathematically combine the reference voltage signal and the feedback voltage signal;
   a loop filter coupled to the summer and configured to filter the mathematically combined signal; and
   a voltage controlled oscillator (VCO) coupled to the loop filter and the feedback loop.

5. The system of claim 4, further comprising:
   a frequency divider coupled between the VCO and the frequency to voltage converter to generate the feedback frequency signal from an output signal of the VCO.

6. The system of claim 4, wherein the loop filter is a low pass filter.

7. A frequency synthesizer, comprising:
   a reference source configured to generate a reference frequency signal;
   a feedback loop system that includes first and second loops, the first loop including a first variable device and a converter and a second loop including a second variable device;
   a phase detector configured to compare phases of the reference frequency signal with a signal output from the second loop;
   a first loop filter coupled to the phase detector and configured to smooth an output signal of the phase detector;
   a summer coupled to the first loop filter and the first loop and configured to mathematically combine the smoothed output signal and a signal output from the first loop;
   a second loop filter coupled to the summer and configured to smooth the mathematically combined signal; and
   a voltage to frequency converter coupled to the second loop filter and the feedback loop system.

8. The frequency synthesizer of claim 7, wherein the frequency synthesizer is adapted into a wireless data communications device.

9. The frequency synthesizer of claim 7, wherein the converter is a frequency to voltage converter.

10. The frequency synthesizer of claim 9, wherein the frequency to voltage converter includes an XOR gate logic device having first and second XOR input nodes and an XOR output node, a time delay device having a delay input node and a delay output node, and a capacitor.

11. The frequency synthesizer of claim 10, wherein the first XOR input node and the delay input node are coupled to the voltage to frequency converter, the second XOR input node is coupled to the delay output node and the XOR output node is coupled to a capacitor.

12. The frequency synthesizer of claim 9, further comprising a constant current source and a switching device, wherein the frequency to voltage converter includes a capacitor coupled to the constant current source via the switching device.

13. A closed-loop voltage-to-frequency converter circuit, comprising:
- a VCO (14) having a voltage input and a frequency output ($f_o$); and
- a voltage-locked loop for controlling the voltage input to the VCO (14), including:
  - a divider (18) coupled to the frequency output (fo) for generating a divided feedback frequency signal;
  - a frequency-to-voltage (F/V) converter (16) coupled to the divided feedback frequency signal for generating a corresponding feedback voltage signal, wherein the frequency-to-voltage (FN) converter (16) includes an XOR gate (20), a delay element (22), and a capacitor; and
  - a subtractor circuit (10) coupled to the feedback voltage signal and a reference voltage (Vi) for generating a voltage control signal that is coupled to the voltage input of the VCO (14).

14. The circuit of claim 13, wherein the XOR gate includes first and second input nodes and an output node, the first input node coupled to the divided feedback frequency signal, the second input node coupled to a time delayed version of the divided feedback frequency signal output from the delay element, and the output node coupled to the capacitor.

15. A closed-loop voltage-to-frequency converter circuit, comprising:
- a VCO having a voltage input and a frequency output (fo); and
- a voltage-locked loop for controlling the voltage input to the VCO, including:
  - a divider coupled to the frequency output (fo) for generating a divided feedback frequency signal;
  - a frequency-to-voltage (F/V) converter coupled to the divided feedback frequency signal for generating a corresponding feedback voltage signal, wherein the frequency-to-voltage (F/V) converter includes a constant current source, a capacitor, and a switching device, wherein the capacitor is coupled to the constant current source via the switching device; and
  - a subtractor circuit coupled to the feedback voltage signal and a reference voltage (Vi) for generating a voltage control signal that is coupled to the voltage input of the VCO.

16. A phase locked loop (PLL) frequency synthesizer comprising:
- a reference source configured to generate a reference frequency signal;
- a phase detector configured to compare phases of the reference frequency signal and a first feedback signal;
- a first loop filter coupled to the phase detector and configured to smooth an output signal of the phase detector;
- a closed-loop voltage-to-frequency converter circuit coupled to the first loop filter and configured to generate an output synthesized frequency signal; and
- a first feedback loop including a frequency divider configured to divide the frequency of the output synthesized frequency signal to thereby generate the first feedback signal;

wherein the closed-loop voltage-to-frequency converter comprises:
- a summer coupled to the first loop filter and a second feedback loop and configured to mathematically combine the smoothed output signal and a second feedback signal;
- a second loop filter coupled to the summer to smooth mathematically combined signal;
- a voltage to frequency converter coupled to the second loop filter and configured to generate the output synthesized frequency signal; and
- a second feedback loop comprising a frequency divider coupled to the voltage to frequency converter and a frequency to voltage converter coupled to the second frequency divider and configured to generate the second feedback signal.

17. A wireless communication device comprising:

an antenna;

a receiver coupled to the antenna for receiving communication signals having a receive channel frequency; and a frequency synthesizer for generating a local oscillator (LO) signal, the frequency synthesizer comprising:
- a reference source configured to generate a reference frequency signal;
- a feedback loop system that includes first and second loops, the first loop including a first variable device and a converter and the second loop including a second variable device;
- a phase detector configured to compare phases of the reference frequency signal with a signal output from the second loop;
- a first loop filter coupled to the phase detector and configured to smooth an output signal of the phase detector;
- a summer coupled to the first loop filter and the first loop and configured to mathematically combine the smoothed output signal and a signal output from the first loop;
- a second loop filter coupled to the summer and configured to smooth the mathematically combined signal; and
- a voltage to frequency converter coupled to the second loop filter and the feedback loop system and configured to generate the LO signal.

18. The wireless communication device of claim 17, further comprising a transmitter coupled to the antenna for transmitting communication signals at a transmit channel frequency.

19. The wireless communication device of claim 18, wherein the receive signal frequency and the transmit signal frequency are radio frequencies (RF).

20. The wireless communication device of claim 19, wherein the receiver comprises a frequency down converter configured to convert received RF communication signals into intermediate frequency (IF) signals using the LO signal, and the transmitter comprises a frequency up converter configured to convert IF signals into RF communication signals using the LO signal.

21. The wireless communication device of claim 20 wherein the receiver further comprises a first quadrature mixer for resolving the IF signals into baseband in-phase and quadrature components, and the transmitter further comprises a second quadrature mixer for combining baseband in-phase and quadrature signal components into IF signals.

22. The wireless communication device of claim 21, further comprising a second frequency synthesizer for generating a second LO signal, wherein the first and second quadrature mixers use the second LO signal to respectively resolve the IF signals into baseband components and combine the baseband components into IF signals.

23. A wireless data communication device having a transmit path, a receive path, and one or more phase-locked loop frequency synthesizers, the one or more phase-locked loop frequency synthesizers including:
a closed-loop voltage to frequency converter comprising:
a voltage controlled oscillator (VCO) having a voltage input and a frequency output; and
a voltage locked loop (VLL) coupled to the VCO for controlling the voltage input in response to the frequency output, the VLL including a frequency-to-voltage converter for generating a feedback voltage signal from a feedback frequency signal, and a subtractor circuit coupled to the feedback voltage signal and a reference voltage signal for generating the voltage input to the VCO, wherein the frequency-to-voltage converter includes an XOR gate, a delay element, and a capacitor.

24. A wireless data communication device having a transmit path, a receive path, and one or more phase-locked loop frequency synthesizers, the one or more phase-locked loop frequency synthesizers including:
a closed-loop voltage to frequency converter comprising:
a voltage controlled oscillator (VCO) having a voltage input and a frequency output; and
a voltage locked loop (VLL) coupled to the VCO for controlling the voltage input in response to the frequency output, the VLL including a frequency-to-voltage converter for generating a feedback voltage signal from a feedback frequency signal, and a subtractor circuit coupled to the feedback voltage signal and a reference voltage signal for generating the voltage input to the VCO, wherein the frequency-to-voltage converter includes a current source, a switch, and a capacitor.

* * * * *